(12) United States Patent
Franz et al.

(10) Patent No.: US 7,051,179 B2
(45) Date of Patent: May 23, 2006

(54) METHOD AND SYSTEM FOR SUPPORTING MULTIPLE CACHE CONFIGURATIONS

(75) Inventors: Keenan W. Franz, Austin, TX (US); Michael T. Vaden, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 10/664,455

(22) Filed: Sep. 18, 2003

(65) Prior Publication Data

US 2004/0062068 A1 Apr. 1, 2004

Related U.S. Application Data

(62) Division of application No. 09/731,869, filed on Dec. 7, 2000, now Pat. No. 6,760,272.

(51) Int. Cl.
*G06F 12/00* (2006.01)
*G06F 9/24* (2006.01)

(52) U.S. Cl. .................. 711/170; 711/118; 711/129; 711/173

(58) Field of Classification Search ........... 711/118, 711/129, 131, 145, 147, 153, 170, 171, 172, 711/173, 128, 166; 365/189.01, 189.02, 365/189.03, 230.05, 230.02, 230.03; 713/2
See application file for complete search history.

(56) References Cited

U.S. PATENT DOCUMENTS

| | | | | | |
|---|---|---|---|---|---|
| 5,014,195 A | * | 5/1991 | Farrell et al. | ............... | 711/128 |
| 6,606,686 B1 | * | 8/2003 | Agarwala et al. | ........... | 711/129 |
| 6,760,272 B1 | * | 7/2004 | Franz et al. | ........... | 365/230.05 |

* cited by examiner

*Primary Examiner*—B. James Peikari

(74) *Attorney, Agent, or Firm*—Cardinal Law Group; Casimer K. Salys

(57) ABSTRACT

A processor card for supporting multiple cache configurations, and a microprocessor for selecting one of the multiple cache configurations is disclosed. The processor card has a first static random access memory mounted on a front side thereof and a second static random access memory mounted on a rear side thereof. The address pins of the memories are aligned. Each pair of aligned address pins are electrically coupled to thereby concurrently receive an address bit signal from the microprocessor. During an initial boot of the microprocessor, the microprocessor includes a multiplexor for providing the address bit signals to the address pins in response to a control signal indicative of a selected cache configuration.

9 Claims, 4 Drawing Sheets

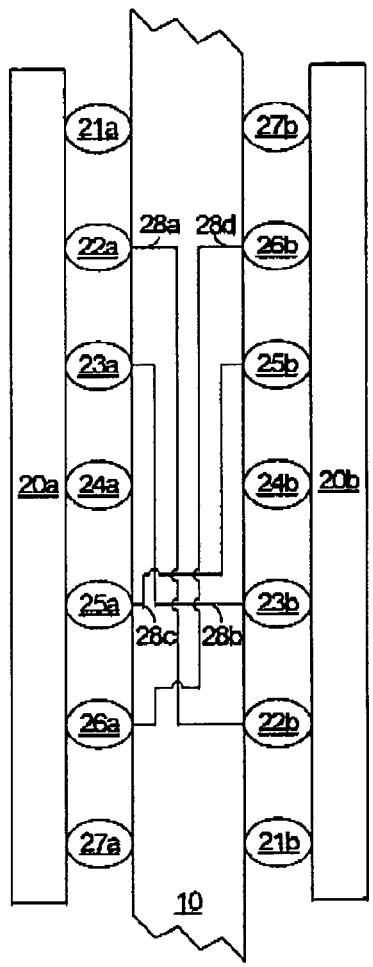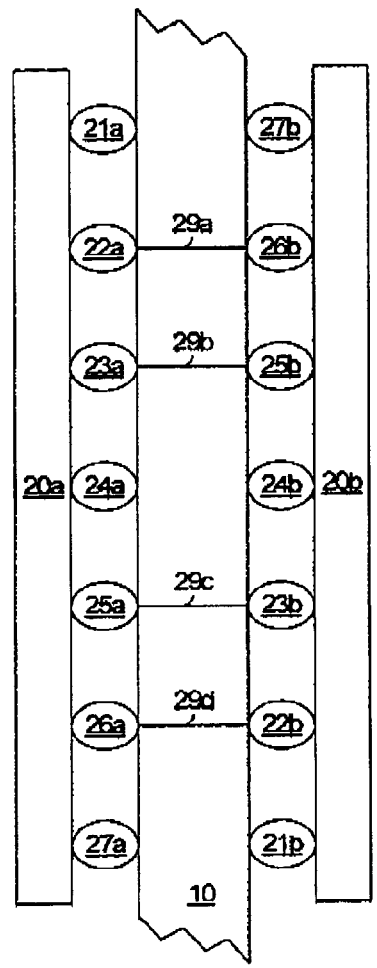
FIG. 1
(PRIOR ART)
FIG. 2

METHOD AND SYSTEM FOR SUPPORTING MULTIPLE CACHE CONFIGURATIONS

This application claims priority as a divisional application of U.S. patent application Ser. No. 09/731,869 filed Dec. 7, 2000, which has issued as U.S. Pat. No. 6,760,272.

BACKGROUND OF THE INVENTION

Referring to FIG. 1, an electrical coupling network between a static random access memory 20a (hereinafter "SRAM 20a") and a static random access memory 20b (hereinafter "SRAM 20b") is shown. SRAM 20a and SRAM 20b are identical memory devices. Specifically, both SRAM 20a and SRAM 20b have an identical pin arrangement including seven (7) rows and seventeen (17) columns of pins. The first column of pins are shown in FIG. 1. In the first column of pins, SRAM 20a includes two (2) output power supply pins 21a and 27a, and SRAM 20b includes two (2) output power supply pins 21b and 27b. Also in the first column of pins, SRAM 20a includes four (4) synchronous address input pins 22a, 23a, 25a, and 26a, and SRAM 20b includes four (4) synchronous address input pins 22b, 23b, 25b, and 26b. Pin 24a of SRAM 20a and pin 24b of SRAM 20b are not utilized.

In support of four (4) cache configurations, SRAM 20a is mounted to a front side of a processor card 10, and SRAM 20b is mounted to a rear side of processor card 10. SRAM 20a and SRAM 20b are positioned with an alignment of pin 21a and pin 27b, an alignment of pin 22a and pin 26b, an alignment of pin 23a and pin 25b, an alignment of pin 24a and pin 24b, an alignment of pin 25a and pin 23b, an alignment of pin 26a and pin 22b, and an alignment of pin 27a and pin 21b.

Pin 22a and pin 22b are functionally equivalent and electrically coupled via a conductor 28a within processor card 10 to concurrently receive a first address bit signal from a microprocessor. Pin 23a and pin 23b are functionally equivalent and electrically coupled via a conductor 28b within processor card 10 to concurrently receive a second address bit signal from the microprocessor. Pin 25a and pin 25b are functionally equivalent and electrically coupled via a conductor 28c within processor card 10 to concurrently receive a third address bit signal from the microprocessor. Pin 26a and pin 26b are functionally equivalent and electrically coupled via a conductor 28d within processor card 10 to concurrently receive a fourth address bit signal from the microprocessor. The four (4) address bits signal are selectively provided by the microprocessor as a function of a selected cache configuration.

A drawback associated with the aforementioned electrical couplings as shown is the length of conductors 28a–28d tends to establish a maximum frequency at which the microprocessor can effectively and efficiently control SRAM 20a and SRAM 20b, and the established maximum frequency can be significantly lower than a desired operating frequency of the microprocessor. The computer industry is therefore continually striving to improve upon the electrical coupling between the synchronous address input pins of SRAM 20a and SRAM 20b whereby a maximum frequency at which a microprocessor can effectively and efficiently control SRAM 20a and SRAM 20b matches a desired operating frequency of the microprocessor. The computer industry is also continually striving to improve upon the electrical communication of a selected cache configuration from a microprocessor to the synchronous address input pins of SRAM 20a and SRAM 20b.

FIELD OF THE INVENTION

The present invention generally relates to computer hardware mounted upon a processor card, and in particular to an electrical coupling between memory components for supporting multiple cache configurations and an electrical communication from a microprocessor to the memory components for selecting one of the supported multiple cache configurations.

SUMMARY OF THE INVENTION

One form of the present invention is a processor card having a first memory device and a second memory device mounted thereon. The first memory device includes a first address pin and a second address pin. The second memory device includes a third address pin and a fourth address pin. The first address pin of the first memory device and the third address pin of the second memory device are functionally equivalent address pins. The second address pin of the first memory device and the fourth address pin are functionally equivalent address pins. The first address pin of the first memory device and the fourth address pin of the second memory device are electrically coupled to thereby concurrently receive a first address bit signal. The second address pin of the first memory device and the third address pin of the second memory device are electrically coupled to thereby concurrently receive a second address bit signal.

Another form of the present invention is a system including a first memory device, a second memory device, and a microprocessor. The first memory device includes a first address pin and a second address pin. The second memory device includes one address pin and a fourth address pin. The first address pin of the first memory device and the third address pin of the second memory device are functionally equivalent address pins. The second address pin of the first memory device and the fourth address pin are functionally equivalent address pins. The microprocessor is operable to concurrently provide a first address bit signal to first address pin of the first memory device and the fourth address pin of the second memory device. The microprocessor is further operable to concurrently provide a first address bit signal to second address pin of the first memory device and the third address pin of the second memory device.

The foregoing and other features and advantages of the invention will become further apparent from the following detailed description of the presently preferred embodiments, read in conjunction with the accompanying drawings. The detailed description and drawings are merely illustrative of the invention rather than limiting, the scope of the invention being defined by the appended claims and equivalents thereof.

BRIEF DESCRIPTION OF THE DRAWINGS

FIG. 1 is a fragmented side view of a processor card having a pair of static random accesses memories mounted thereon with an electrical coupling of synchronous address pins as known in the art;

FIG. 2 is view of the FIG. 1 processor card and FIG. 1 static random accesses memories with an electrical coupling of synchronous address pins in accordance with the present invention;

DETAILED DESCRIPTION OF THE PRESENTLY PREFERRED EMBODIMENTS

Figure 3A:
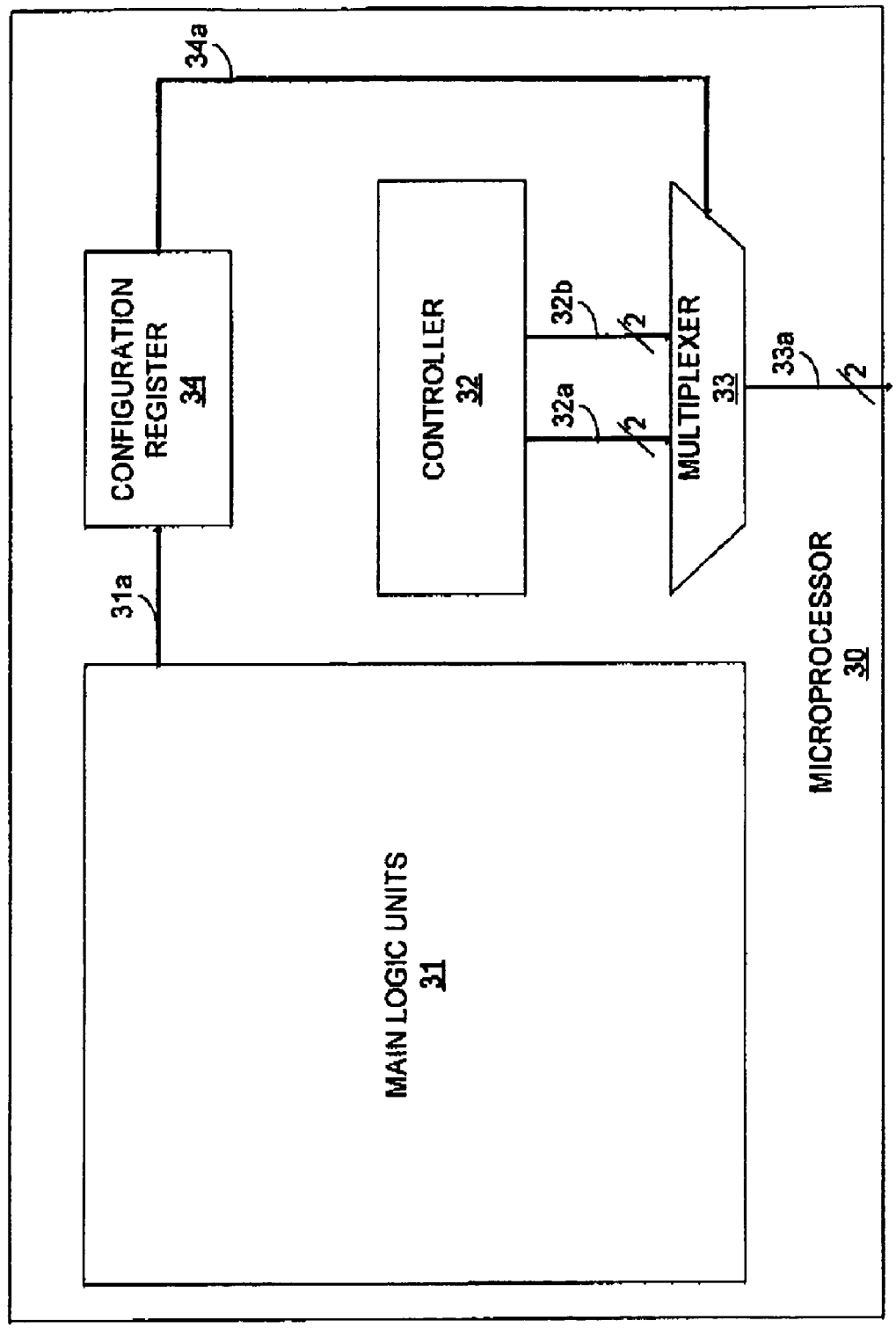
FIG. 3A is a general block diagram of a first embodiment of a microprocessor in accordance with the present invention.

Referring to FIG. 2, SRAM 20a and SRAM 20b are mounted upon processor card 10 as previously described in connection with FIG. 1. In accordance with the present invention, pin 22a and pin 26b are electrically coupled via a conductor 29a within processor card 10 to concurrently receive a first address bit signal. Pin 23a and pin 25b are electrically coupled via a conductor 29b within processor card 10 to concurrently receive a second address bit signal. Pin 25a and pin 23b are electrically coupled via a conductor 29c within processor card 10 to concurrently receive a third address bit signal. Pin 26a and pin 22b are electrically coupled via a conductor 29d within processor card 10 to concurrently receive a fourth address bit signal. The length of the conductors 29a–29d facilitate an effective and efficient operation of SRAM 20a and SRAM 20b over a wide range of operating frequencies of a microprocessor.

Referring to FIG. 3A, a microprocessor 30 in accordance with the present invention for selecting between two (2) of the four (4) cache configurations supported by SRAM 20a and SRAM 20b is shown. Microprocessor 30 includes main logic units 31 for interpreting and executing operating and application programs as would occur to one skilled in the art. Microprocessor 30 further includes a controller 32 and a multiplexer 33. Address bus 32a and address bus 32b provide electrical communication between controller 32 and multiplexer 33. Address bus 32a and address bus 32b each have two (2) address lines. Multiplexer 33 has an address bus 33a with a first address line electrically coupled to pin 22a (FIG. 2) and pin 26b (FIG. 2), and a second address line electrically coupled to pin 26a (FIG. 2) and pin 22b (FIG. 2). The following Table 1 exemplary illustrates an address bit logic utilized by main logic units 31 for electrically communicating a selected cache configuration between an 8 Mbyte cache and a 16 Mbyte cache to SRAM 20a and SRAM 20b.

TABLE 1

| ADDRESS BUS | CACHE SIZE | FIRST ADDRESS LINE (MSB) | SECOND ADDRESS LINE (LSB) |
| --- | --- | --- | --- |
| 32a | 8 Mbyte | net2 | net2 |
| 32b | 16 Mbyte | net1 | net2 |

Still referring to FIG. 3A, microprocessor 30 further comprises a configuration register 34. Configuration register 34 provides a control signal to multiplexor 33 via a control bus 34a in response to a selection signal from main logic units 31 via a data bus 31a. The selection signal is indicative of a selected cache configuration by main logic units 31 during an initial boot of microprocessor 30. The control signal is indicative of the address bus that corresponds to the selected cache configuration. Consequently, multiplexor 33 provides the appropriate address signals via address bus 33a to SRAM 20a and SRAM 20b in response to the selection signal. For example, when the selection signal indicates the 16 Mbyte cache has been selected during an initial boot of microprocessor 30, pin 22a and pin 26b concurrently receive address signal net1, and pin 26a and pin 22b concurrently receive address signal net2 as indicated by Table 1.

Figure 3B:
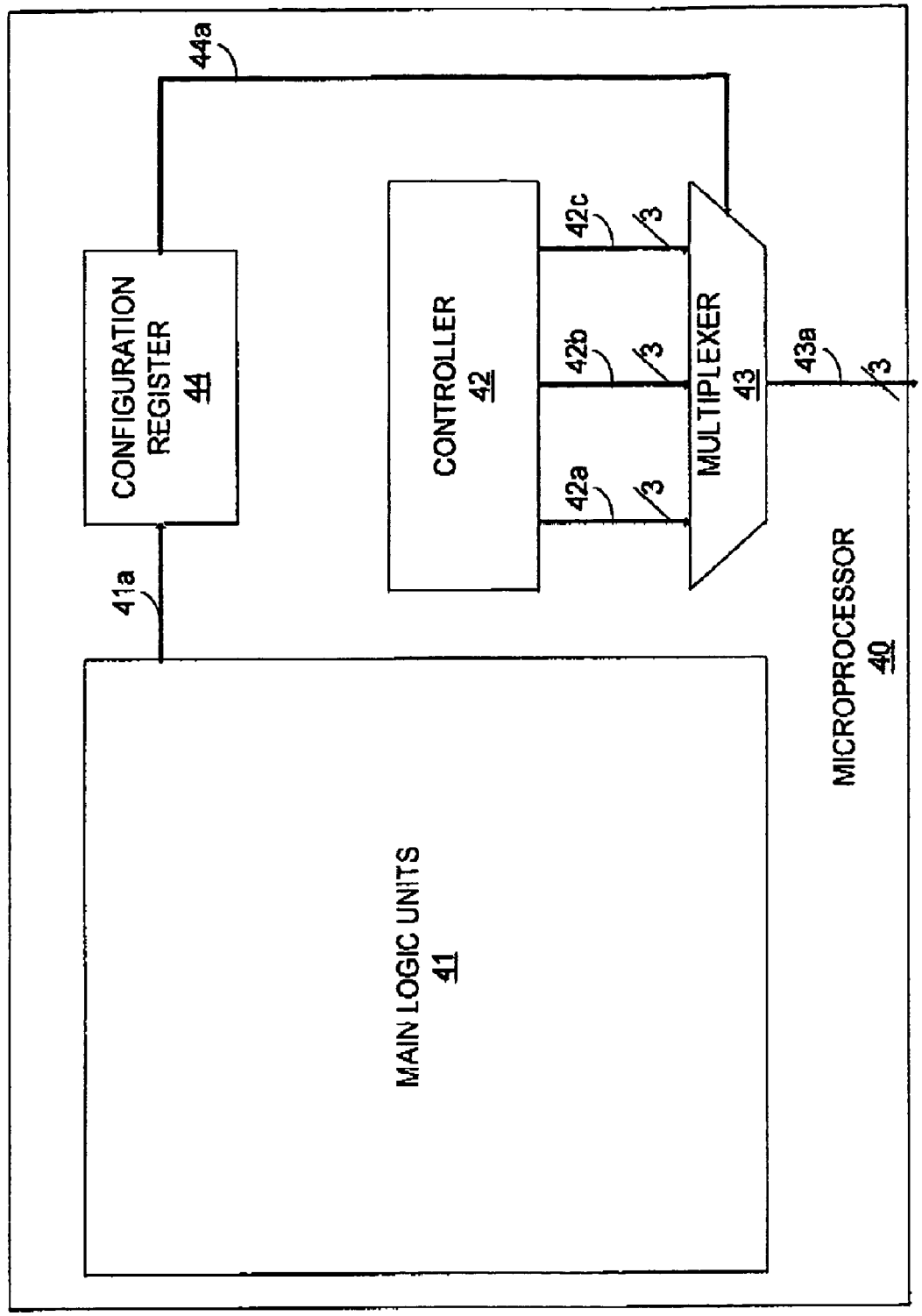
FIG. 3B is a general block diagram of a second embodiment of a microprocessor in accordance with the present invention.

Referring to FIG. 3B, a microprocessor 40 in accordance with the present invention for selecting between three (3) of the four (4) cache configurations supported by SRAM 20a and SRAM 20b is shown. Microprocessor 40 includes main logic units 41 for interpreting and executing operating and application programs as would occur to one skilled in the art. Microprocessor 40 further includes a controller 42 and a multiplexer 43. Address bus 42a, address bus 42b, and address bus 42c provide electrical communication between controller 42 and multiplexer 43. Address bus 42a address bus 42b, and address bus 42c each have three (3) address lines. Multiplexer 43 has an address bus 43a with a first address line electrically coupled to pin 22a (FIG. 2) and pin 26b (FIG. 2), a second address line electrically coupled to pin 26a (FIG. 2) and pin 22b (FIG. 2), and a third address line electrically coupled to pin 23a (FIG. 2) and pin 25b (FIG. 2). The following Table 2 exemplary illustrates the address bit logic utilized by main logic units 41 for electrically communicating a selected cache configuration between a 4 Mbyte cache, an 8 Mbyte cache and a 16 Mbyte cache to SRAM 20a and SRAM 20b.

TABLE 2

| ADDRESS BUS | CACHE SIZE | FIRST ADDRESS LINE (MSB) | SECOND ADDRESS LINE | THIRD ADDRESS LINE (LSB) |
| --- | --- | --- | --- | --- |
| 32a | 4 Mbyte | net3 | net3 | net3 |
| 32b | 8 Mbyte | net2 | net2 | net3 |
| 32c | 16 Mbyte | net1 | net2 | net3 |

Still referring to FIG. 3B, microprocessor 40 further comprises a configuration register 44. Configuration register 44 provides a control signal to multiplexor 43 via a control bus 44a in response to a selection signal from main logic units 41 via a data bus 41a. The selection signal is indicative of a selected cache configuration by main logic units 41 during an initial boot of microprocessor 40. The control signal is indicative of the address bus that corresponds to the selected cache configuration. Consequently, multiplexor 43 provides the appropriate address signals via address bus 43a to SRAM 20a and SRAM 20b in response to the selection signal. For example, when the selection signal indicates the 8 Mbyte cache has been selected, pin 22a and pin 26b concurrently receive address signal net2, pin 26a and pin 22b concurrently receive address signal net2, and pin 23a and pin 25b concurrently receive address signal net3 as indicated by Table 2.

Figure 3C:
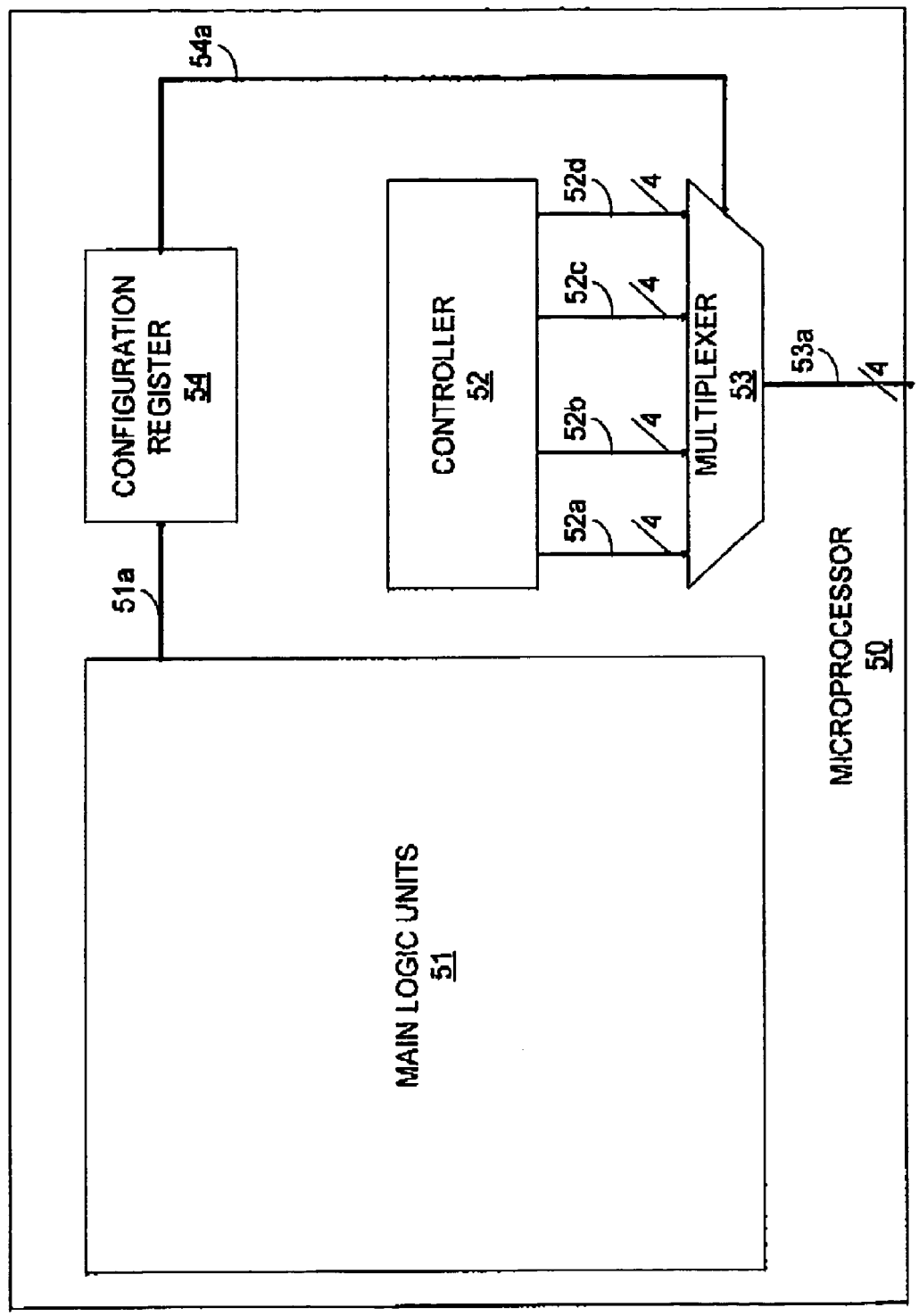
FIG. 3C is a general block diagram of one embodiment of a microprocessor in accordance with the present invention.

Referring to FIG. 3C, a microprocessor 50 in accordance with the present invention for selecting between all four (4) cache configurations supported by SRAM 20a and SRAM 20b is shown. Microprocessor 50 includes main logic units 51 for interpreting and executing operating and application programs as would occur to one skilled in the art. Microprocessor 50 further includes a controller 52 and a multiplexer 53. Address bus 52a, address bus 52b, address bus 52c, and address bus 52d provide electrical communication between controller 52 and multiplexer 53. Address bus 52a address bus 52b, address bus 52c, and address bus 52d each have four (4) address lines. Multiplexer 53 has an address bus 53a with a first address line electrically coupled to pin 22a (FIG. 2) and pin 26b (FIG. 2), a second address line electrically coupled to pin 26a (FIG. 2) and pin 22b (FIG. 2), a third address line electrically coupled to pin 23a (FIG. 2) and pin 25b (FIG. 2), and a fourth address line electrically coupled to pin 23b (FIG. 2) and pin 25a (FIG. 2). The following Table 3 exemplary illustrates the address bit logic utilized by main logic units 51 for electrically communicating a selected cache configuration between a 2 Mbyte cache, a 4 Mbyte cache, an 8 Mbyte cache and a 16 Mbyte cache to SRAM 20a and SRAM 20b.

TABLE 3

| ADDRESS BUS | CACHE SIZE | FIRST ADDRESS LINE (MSB) | SECOND ADDRESS LINE | THIRD ADDRESS LINE | FOURTH ADDRESS LINE (LSB) |
|---|---|---|---|---|---|
| 32a | 2 Mbyte | net4 | net4 | net4 | net4 |
| 32b | 4 Mbyte | net3 | net3 | net3 | net4 |
| 32c | 8 Mbyte | net2 | net2 | net3 | net4 |
| 32d | 16 Mbyte | net1 | net2 | net3 | net4 |

Still referring to FIG. 3C, microprocessor 50 further comprises a configuration register 54. Configuration register 54 provides a control signal to multiplexor 53 via a control bus 54a in response to a selection signal from main logic units 51 via a data bus 51a. The selection signal is indicative of a selected cache configuration by main logic units 51 during an initial boot of microprocessor 50. The control signal is indicative of the address bus that corresponds to the selected cache configuration. Consequently, multiplexor 53 provides the appropriate address signals via address bus 53a to SRAM 20a and SRAM 20b in response to the selection signal. For example, when the selection signal indicates the 8 Mbyte cache has been selected, pin 22a and pin 26b concurrently receive address signal net2, pin 26a and pin 22b concurrently receive address signal net2, pin 23a and pin 25b concurrently receive address signal net3, and pin 23b and pin 25a concurrently receive address signal net4 as indicated by Table 3.

From the previous description of SRAM 20a and SRAM 20b herein in connection with FIG. 2, one skilled in the art will know how to make and use electrical couplings between additional synchronous address pins of SRAM 20a and SRAM 20b in accordance with the present invention. From the previous description of microprocessors 30, 40, and 50 in connection with FIGS. 3A–3C, respectively, one skilled in the art will know how to make and use microprocessors in accordance with the present invention for selecting a cache configuration between five or more supported cache configurations.

While the embodiments of the present invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein. For examples, the pin configuration and size of SRAM 20a and SRAM 20b can vary, and/or SRAM 20a and SRAM 20b may include asynchronous address pins. Additionally, SRAM 20a and SRAM 20b may be misaligned along the respective sides of processor card 10, and/or mounted on the same side of processor card 10. Also, other memory devices may be utilized in lieu of SRAM 20a and SRAM 20b, e.g. dynamic static random access memories.

We claim:

1. A method of operating a microprocessor for supporting multiple cache configurations, the method comprising:

generating a first set of at least two address bit signals indicative of a first cache configuration among the multiple cache configurations; and generating a second set of at least two address bit signals indicative of a second cache configuration among the multiple cache configurations;

selecting the first cache configuration during a first boot of the microprocessor; and communicating the first set of at least two address bit signals to a first memory device and a second memory device as an indication of the selection of the first cache configuration among the multiple cache configurations during the first boot of the microprocessor.

2. The method of claim 1, further comprising:

selecting the second cache configuration during a second boot of the microprocessor; and communicating the second set of at least two address bit signals to the first memory device and the second memory device as an indication of the selection of the second cache configuration among the multiple cache configurations during the second boot of the microprocessor.

3. In a microprocessor including a controller and a multiplexor, a method of operating the microprocessor for supporting multiple cache configurations, the method comprising:

operating the controller to generate a first set of at least two address bit signals indicative of a first cache configuration among the multiple cache configurations;

operating the controller to generate second set of at least two address bit signals indicative of a second cache configuration among the multiple cache configurations; and operating the multiplexor to selectively communicate either the first set of at least two address bit signals or the second set of at least two address bit signals to a first memory device and a second memory device, wherein a communication of the first set of at least two address bit signals to the first memory device and the second memory device is an indication of a selection of the first cache configuration during a boot of the microprocessor, and wherein a communication of the second set of at least two address bit signals to the first memory device and the second memory device is an indication of a selection of the second cache configuration during the boot of the microprocessor.

4. In a microprocessor including a controller and a multiplexor, a method of operating the microprocessor for supporting multiple cache configurations, the method comprising:

operating the controller to generate a first set of at least two address bit signals indicative of a first cache configuration among the multiple cache configurations; and operating the multiplexor to communicate the first set of at least two address bit signals to a first memory device and a second memory device as an indication of a selection of the first cache configuration during a first boot of the microprocessor.

5. The method of claim 4, further comprising:

operating the controller to generate a second set of at least two address bit signals indicative of a second cache configuration among the multiple cache configurations; and operating the multiplexor to communicate the second set of at least two address bit signals to the first memory device and the second memory device as an indication of a selection of the second cache configuration during a second boot of the microprocessor.

6. A method, comprising:

operating a microprocessor to generate a first set of at least two address bit signals, said first set of at least two address bit signals being indicative of a first cache configuration; and operating said microprocessor to generate a second set of at least two address bit signals, said second set of at least two address bit signals being indicative of said second cache configuration of said plurality of cache configurations; and operating said microprocessor to send the first and second set of address bit signals to a first and second memory device, the first memory device including a first and second address pin and the second memory device including a third and fourth address pin, wherein said first address pin and said fourth address pin are electrically coupled to thereby concurrently receive a first address bit signal, and wherein said second address pin and said third address pin are electrically coupled to thereby concurrently receive a second address bit signal.

7. The method of claim 6 wherein the cache configuration represents a size of the cache.

8. The method of claim 6 further comprising:

selecting the first cache configuration during a first boot of the microprocessor; and communicating the first set of at least two address bit signals to the first memory device and the second memory device as an indication of the selection of the first cache configuration among the multiple cache configurations during the first boot of the microprocessor.

9. The method of claim 8 further comprising:

selecting a second cache configuration among the multiple cache configurations during a second boot of the microprocessor; and communicating the selection of the second cache configuration among the multiple cache configurations during the second boot of the microprocessor to the first memory device and the second memory device.

* * * * *